Feb. 28, 1961 R. R. STONE, JR 2,973,483

FREQUENCY SYNTHESIZER EMPLOYING CARRIER AND SIDEBAND SELECTION

Filed Jan. 27, 1959 3 Sheets-Sheet 1

INVENTOR
ROBERT R. STONE., JR.

BY Richard [signature]
ATTORNEY

Feb. 28, 1961 R. R. STONE, JR 2,973,483

FREQUENCY SYNTHESIZER EMPLOYING CARRIER AND SIDEBAND SELECTION

Filed Jan. 27, 1959 3 Sheets-Sheet 2

INVENTOR
ROBERT R. STONE., JR.

BY Richard C. Reed

ATTORNEY

FREQUENCY SYNTHESIZER EMPLOYING CARRIER AND SIDEBAND SELECTION

Filed Jan. 27, 1959 3 Sheets-Sheet 3

INVENTOR
ROBERT R. STONE, JR.

BY Richard C Reed
ATTORNEY

United States Patent Office 2,973,483

Patented Feb. 28, 1961

2,973,483

FREQUENCY SYNTHESIZER EMPLOYING CARRIER AND SIDEBAND SELECTION

Robert R. Stone, Jr., Rosecroft Park, Md., assignor to the United States of America as represented by the Secretary of the Navy Filed Jan. 27, 1959, Ser. No. 789,460

2 Claims. (Cl. 331—38)

(Granted under Title 35, U.S. Code (1952), sec. 266)

The invention described herein may be manufactured and used by or for the Government of the United States of America for governmental purposes without the payment of any royalties thereon or therefor.

This invention relates in general to a signal generator and in particular to a frequency synthesizer capable of providing a desired signal within a wide range of frequencies without generating unwanted sidebands.

In a conventional synthesizer, where the final output is the sum or difference of two or more independent frequencies, unwanted sidebands as well as desired frequencies are generated. The usual arrangement for eliminating the unwanted sidebands employs a filter circuit which will pass only the desired frequencies, but in many cases the desired frequencies and the unwanted sidebands are so close that the undesired one can not be or, at best, requires expensive units to be filtered out.

Accordingly, it is an object of the present invention to provide a frequency synthesizer in which selected frequencies can be combined in each stage in such a manner that the output signal of the stage is free of undesired sidebands.

Another object is to provide a frequency synthesizer wherein unwanted sidebands can be easily filtered.

Another object of the present invention is the provision of a frequency synthesizer which does not generate undesired frequencies within the bandpass of selected filters.

Other objects and advantages of the invention will hereinafter become more fully apparent from the following description of the annexed drawings wherein:

Figs. 1 and 2 disclose a preferred embodiment of the present invention.

In accordance with the teachings of the present invention, a signal having a desired frequency is formed in a series of stages in a frequency synthesizer. In each stage, comprising a mixer and a tuned filter, an intelligence signal, having a frequency that determines the value of a digit in the number representing the frequency to be synthesized, is mixed with a carrier. The resulting signal is filtered and fed to the following stage where the frequency of the carrier is increased and mixed with another intelligence signal. The desired signal is obtained in the output stage by subtracting a signal having a frequency equal to that of the carrier of the signal applied from the previous stage. In each stage, the ratio of intelligence signal to carrier frequency, and hence bandpass to frequency response of the tuned filter, is sufficiently small that undesirable sidebands may be suppressed with a comparatively simple filter.

Figure 1:
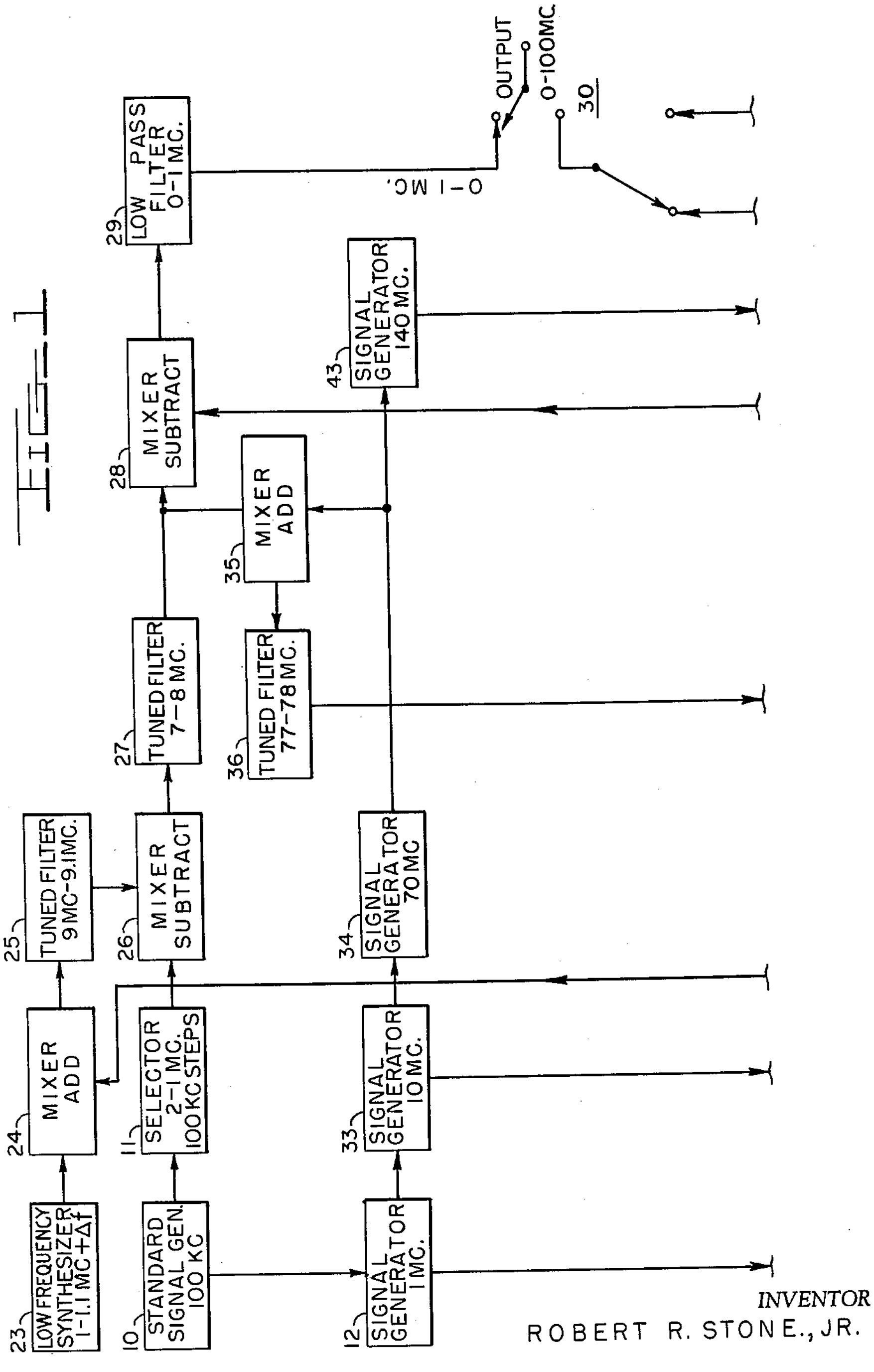
Figure 2:
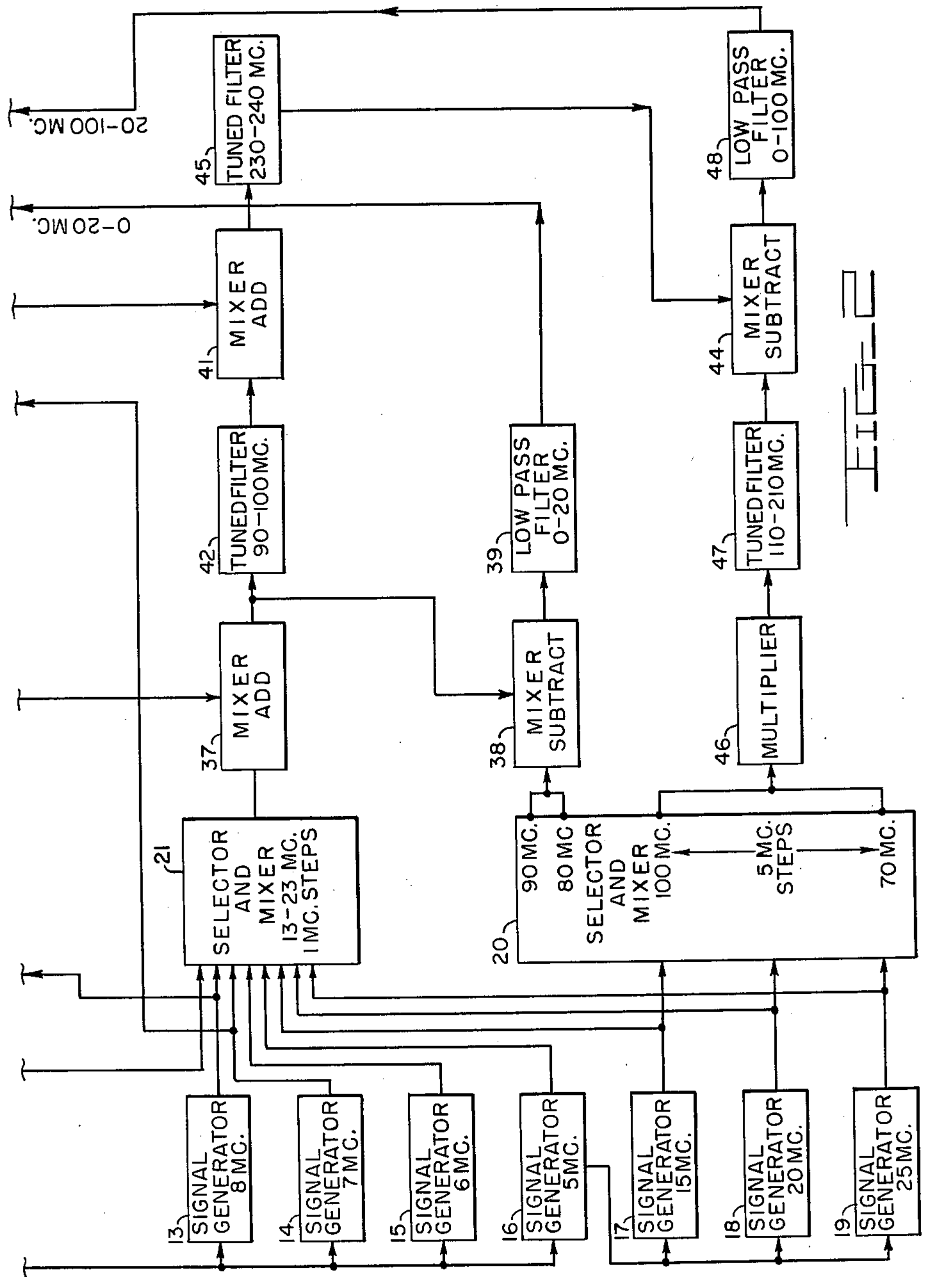

Referring to Figs. 1 and 2, standard signal generator 10 is connected to signal generators 11 and 12. The output of signal generator 12 drives signal generators 13 to 16 to provide signals that are applied to selector and mixer 21; and the output of signal generator 16 is applied to signal generators 17 to 19 to obtain signals that are fed to selector and mixers 20 and 21. Low frequency synthesizer 23 is connected to mixer 24 where the signal applied by the frequency synthesizer is added to the output of signal generator 13 to obtain a signal that is fed to tuned filter 25. The output of tuned filter 25, applied to mixer 26, is subtracted from the output of selector 11 to obtain a signal which is fed through tuned filter 27 to mixer 28. In mixer 28, the output of tuned filter 27 is subtracted from that of signal generator 14 deriving a signal that is fed through low pass filter 29 to one terminal of selector switch 30. An output terminal is connected to the selector switch.

Signal generator 12 drives signal generator 33 which in turn drives signal generator 34 to provide a signal that is added in mixer 35 to the output of tuned filter 27. The signal obtained in mixer 35 is fed through tuned filter 36 to mixer 37 where it is added to a signal provided by selector and mixer 21. The output of mixer 37 is subtracted in mixer 38 from a signal provided by selector and mixer 20 to obtain a signal that is applied through low pass filter 39 to a terminal of switch 30. Signal generator 43, connected between signal generator 34 and mixer 41, applies a signal to the mixer that is added to the one applied by mixer 37 through tuned filter 42. The output of mixer 41 is fed to mixer 44 through tuned filter 45. A selected signal provided by selector and mixer 20 drives multiplier 46 to obtain a signal that is fed through tuned filter 47 to mixer 44 where it is added to the output of tuned filter 45. Finally, low pass filter 48 is connected between the output of mixer 44 and switch 30 to provide a desired signal at the output terminal.

The components in Figs. 1 and 2 may be selected so that the frequency synthesizer disclosed will generate signals in a desired range of frequencies. If, for example, it is desired to synthesize signals within a range of 0–100 mc., standard signal generator 10 should be selected to provide a 100 kc. signal; and signal generators 12 to 19, 33, 34, and 43 should provide 1, 8, 7, 6, 5, 15, 20, 25, 10, 70, and 140 mc., respectively. Selector 11 should be chosen to obtain signals between .2–1 mc. in 0.1 mc. steps, selector and mixer 21 to derive signals between 13–23 mc. in 1 mc. steps and selector and mixer 20 to provide 80 and 90 mc. signals and signals between 70 and 100 mc. in 5 mc. steps. Tuned filter 25 should pass signals having frequencies between 9–9.1 mc. in 10 kc. steps; tuned filter 27, signals having frequencies between 7–8 mc. in 100, 10 and 1 kc. steps and 100, 10 and 1 cycle steps; low pass filter 29, signals between 0–1 mc. in 100, 10 and 1 kc. and 100, 10 and 1 cycle steps. Similarly, tuned filter 42 should be selected to pass signals between 90–100 mc. in 1 mc., 100, 10 and 1 kc., and 100, 10 and 1 cycle steps; tuned filter 45, signals between 230–240 mc. in 1 mc. steps; tuned filter 47, signals having frequencies between 110–210 mc. in 10 mc. steps; and low pass filter 48 signals between 0–100 mc. in 10 mc., 1 mc., 100, 10, and 1 kc., and 100, 10 and 1 cycle steps. Low pass filter 39 should pass signals between 0–20 mc. in the same steps as low pass filter 48.

Low frequency synthesizer 23 may be any signal generator capable of accurately and precisely forming a low frequency signal of the order of less than 0.1 mc.

Figure 4:
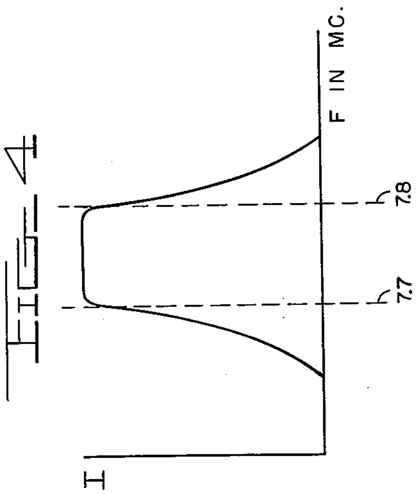
Figs. 4 and 5 are examples of response curves of the tuned filters employed in this invention.
Figure 5:
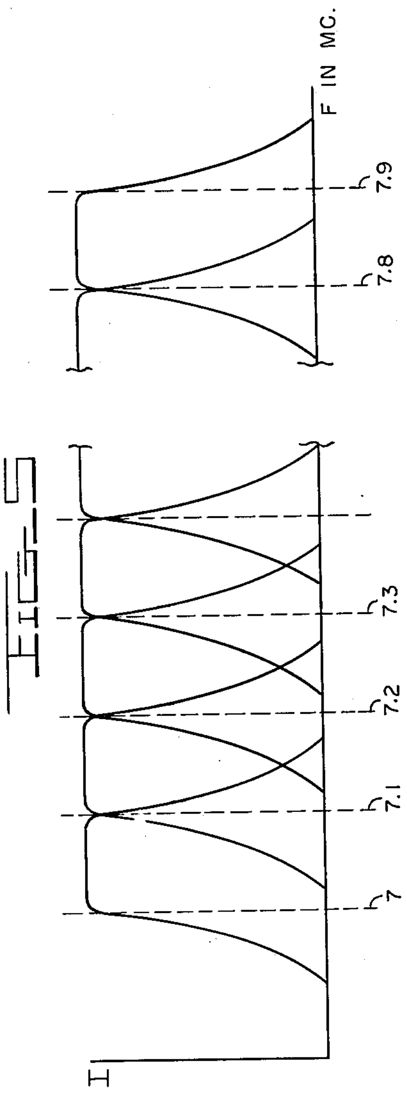
Figure 3:
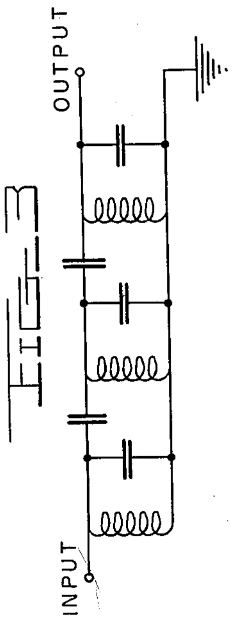
Fig. 3 is a circuit diagram of a tuned filter used in this invention.

Referring to Figs. 3 to 5, while a wide variety of filter circuits may be used, a conventional coupled tuned circuit of the type shown in Fig. 3 is employed in each tuned filter in the embodiment shown in Figs. 1 and 2. As indicated above, tuned filters 25, 27 42, 45, and 47 vary in selected steps. However, tuned filter 36 has a fixed response curve. Fig. 4 illustrates the response curve of tuned filter 36 in which the bandpass is .1 mc.

and the carrier frequency is 7.7 mc. so that the ratio of bandpass to carrier frequency is approximately 1.4%. Similarly, Fig. 5 represents the response curves of tuned filter 27 when the tuned filter is varied in 100 kc. steps from 7–7.9 mc. It is noted that for a carrier of 7 mc. the bandpass is 100 kc. and, therefore, the ratio of bandpass to carrier frequency is approximately 0.14%. The response curve shown in Fig. 5 is typical of the curves for tuned filters 25, 27, 42, 45, and 47.

As a general rule, for satisfactory operation, the ratio of bandpass to carrier frequency in each step of the tuned filters should be of the order of 10% or less; and the frequencies to be heterodyned in each mixer 24, 26, 28, 37, 38, 41 and 44 should be selected so that the frequency difference between the selected frequencies and the center frequency of the bandpass of the tuned filters in each step and the frequency difference between the sidebands of the fifth order or less and the center frequency is at least 5% of the center frequency.

To illustrate the operation of the embodiment shown in Figs. 1 and 2, three typical examples will be considered. In the first, it is desired to synthesize a signal having a frequency equal to 0.1643 mc. Since $\Delta f=0.0643$ mc. is the intelligence component of the signal provided by low frequency synthesizer 23, the synthesizer applies a signal equal to 1.0643 mc. to mixer 24 where it is added to 8 mc. provided by signal generator 13 to obtain 9.0643 mc. (The carrier equals 9.0 mc.) The 9.0643 mc. signal is fed to mixer 26 where it is subtracted from 1.9 mc. supplied by selector 11 to derive 7.1643 mc. (The carrier is now 7.0 mc.) The last signal is fed through tuned filter 27 to mixer 28 where it is subtracted from 7 mc. to provide 0.1643 mc. at the upper terminal of switch 30 so that when the switch is positioned to this terminal the desired signal appears at the output of the frequency synthesizer.

In the second example, a signal equal to 2.1643 mc. is to be synthesized. It will be recalled that in the first example the output of tuned filter 27 is 7.1643 mc. (The carrier is 7.0 mc. and the intelligence signal is 0.1643 mc.) This signal is applied to mixer 35 where it is added to 70 mc. provided by signal generator 34 to obtain 77.1643 mc. (the carrier now is 77.0 mc.) which is fed through tuned filter 36 to mixer 37. In mixer 37, a 15.0 mc. signal is added to 77.1643 to derive 92.1643 mc. (the carrier is 90 mc.) that is fed to mixer 38 where 90 mc. is subtracted to obtain 2.1643 mc., the desired signal. The desired signal is fed through tuned filter 39 and switch 30 to the output terminal of the embodiment shown in Figs. 1 and 2.

In the third example, a signal equal to 32.1643 mc. is to be formed. As indicated above in the second example, the output of mixer 37 is 92.1643 mc. This signal is fed through tuned filter 42 to mixer 41 and added to 140 mc. applied by signal generator 43 to obtain 232.1643 mc. (Here the carrier is 200 mc.) In mixer 44, a signal equal to 200 mc. is subtracted from 232.1643 mc. to provide the desired signal 32.1643 at the output terminal of the frequency synthesizer.

It should be understood, of course, that the foregoing disclosure relates to a preferred embodiment of the invention and that numerous modifications may be made therein without departing from the spirit and scope of the invention as set forth in the appended claims.

What is claimed is:

1. A frequency synthesizer for generating a selected signal by the addition of a plurality of frequencies each indicating a respective one of a plurality of digits in a number representing the selected signal comprising a plurality of stages connected in cascade, each stage including a mixer and a tuned filter, each tuned filter having a bandpass with a selected center frequency, means for generating and applying to the mixer in the first of said plurality of stages a signal having a frequency that comprises a carrier frequency and a frequency indicating at least one of said digits, means for generating and applying to the mixer in the second stage and to the mixer in each alternate stage thereafter a signal having a frequency that is combined with the frequency of the carrier frequency, means for generating and applying to the mixer in the third stage and to the mixer in each alternate stage thereafter a signal indicative of a respective one of said digits, the relationship between the frequencies applied to each mixer being such that the frequency difference between the sidebands of the fifth order or less in the output of the mixer and the center frequency of the associated tuned filter is at least approximately 5% of the center frequency.

2. In a frequency synthesizer, a first mixing means having at least two inputs and at least one output, a first tuned filter connected to said output of said first mixing means and having a selected bandpass with a first center frequency, means for generating and applying a signal having a second frequency to said first mixing means, the relationship between the first frequency, the second frequency, and the first center frequency being such that the frequency difference between the sidebands of the fifth order or less in the output of said first mixing means and said first center frequency is at least approximately 5% of said first center frequency, second mixing means connected to the output of said first tuned filter for providing a selected third frequency, a second tuned filter connected to said first mixing means and having a selected bandpass with a second center frequency, means for generating and applying a signal having a fourth frequency to said second mixing means, the relationship between said selected third frequency, said fourth frequency, and said second center frequency being such that the frequency difference between the sidebands of the fifth order or less in the output of said second mixing means and the second center frequency is at least approximately 5% of said second center frequency, an output circuit, and means for connecting said output circuit to said second tuned filter.

References Cited in the file of this patent

UNITED STATES PATENTS

| | | |
|---|---|---|
| 2,487,857 | Davis | Nov. 15, 1949 |
| 2,666,141 | Clapp et al. | Jan. 12, 1954 |
| 2,829,255 | Bolie | Apr. 1, 1955 |